(12) United States Patent
Wang (10) Patent No.: US 10,148,254 B2
(45) Date of Patent: Dec. 4, 2018

(54) STANDBY CURRENT REDUCTION IN DIGITAL CIRCUITRIES

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 16 days.

(21) Appl. No.: 15/405,747

(22) Filed: Jan. 13, 2017

(65) Prior Publication Data

US 2018/0205368 A1    Jul. 19, 2018

(51) Int. Cl.
| | |
|---|---|
| *G11C 5/14* | (2006.01) |
| *H03K 3/012* | (2006.01) |
| *H03K 3/356* | (2006.01) |
| *G11C 11/412* | (2006.01) |
| *G11C 11/417* | (2006.01) |
| *G11C 11/419* | (2006.01) |

(52) U.S. Cl.
CPC ............ *H03K 3/012* (2013.01); *G11C 11/412* (2013.01); *G11C 11/417* (2013.01); *H03K 3/356104* (2013.01); *G11C 11/419* (2013.01)

(58) Field of Classification Search
CPC ....... H03K 3/012; H03K 3/356; G11C 11/419
USPC ................................................ 327/208, 226
See application file for complete search history.

(56) References Cited

U.S. PATENT DOCUMENTS

| | | | |
|---|---|---|---|
| 6,560,139 B2 | 5/2003 | Ma et al. | |
| 7,039,818 B2 | 5/2006 | Deng et al. | |
| 8,077,510 B2 | 12/2011 | Ouchi et al. | |
| 8,503,221 B1 * | 8/2013 | Hobson | G11C 11/412 365/154 |
| 2008/0284504 A1 * | 11/2008 | Hirota | H03K 19/0016 327/544 |

* cited by examiner

*Primary Examiner* — Dinh T Le
(74) *Attorney, Agent, or Firm* — Muncy, Geissler, Olds & Lowe, PC (57) ABSTRACT

The standby leakage current reduction schemes for digital data storing components are disclosed. By floating the low digital voltage node of the digital data storing components in standby mode, the major standby leakage current paths to the ground voltage caused by the channel diffusion leakage current of MOSFET devices can be terminated. The standby leakage currents will be reduced to the small reverse junction leakage currents to the grounded substrate. For retaining the stored data in the digital data storing components in standby mode, the low digital voltage node is connected to the ground voltage periodically according to a plurality of rectangular voltage pulses outputted from a pulse generator trigged by a low frequency clock oscillator. Due to no external voltage bias to the low digital voltage node other than floating the digital low voltage node, the data recovering process is instant.

21 Claims, 12 Drawing Sheets

STANDBY CURRENT REDUCTION IN DIGITAL CIRCUITRIES

BACKGROUND OF THE INVENTION

Field of the Invention

The invention is related to the methods of standby current reduction in digital circuitries. In particular, the leakage currents for digital data storing components, such as Static Random Access Memory (SRAM) cells, Flip-Flops (FF), data buffers, and data registers, can be significantly reduced in standby state while retaining the stored digital data. Meanwhile the original stored data in the digital data storing components can be recovered instantly for the active mode (read/write operations).

Description of the Related Art

Figure 1A:
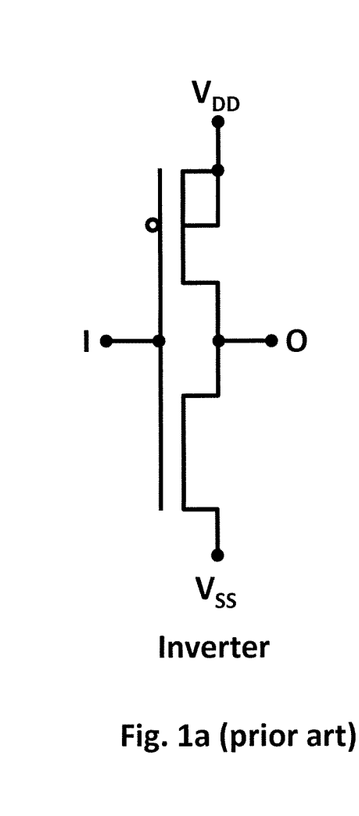
FIGS. 1a-1c show the schematics of logic gates: inverter, NAND2, and NOR2, respectively.
Figure 1B:
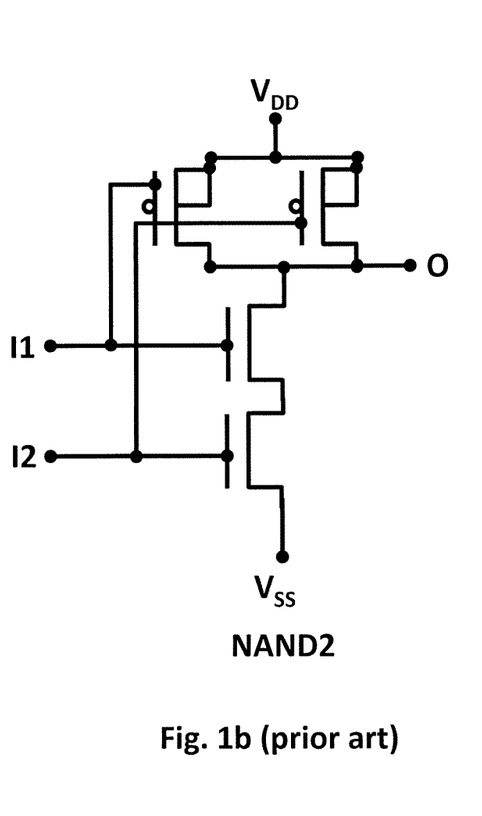
Figure 1C:
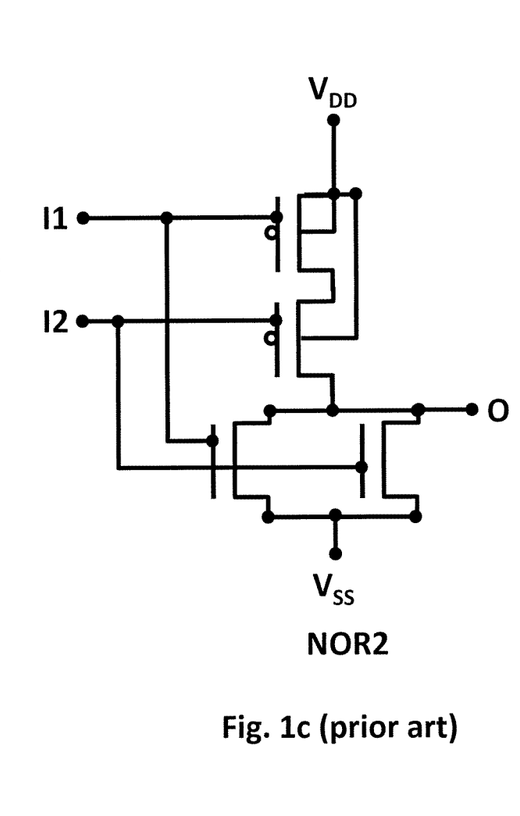

Nowadays digital circuitries are built with Complementary Metal Oxide Semiconductor (CMOS), where the N-type and P-type Metal Oxide Semiconductor Filed Effect Transistor (MOSFET) devices form the complementary pair of an inverter shown in FIG. 1a. The basic combinational logic gates, such NAND gates and NOR gates, can be considered as variations of CMOS inverters with multiple inputs and single output. For examples, NAND2 gate and NOR2 gate are the two inputs/one output types of CMOS inverters shown in FIG. 1b and FIG. 1c, respectively. It has also been mathematically proven that all the logic computations can be performed by the combinations of NAND gates, NOR gates, and inverter gates.

In digital circuitries, the combinational logic gates take the digital input data for logic computing operations and the digital memories store the digital information of the instructions for manipulating logic operations and the digital data from the inputs/outputs of the logic operations. The power consumption for digital computations is given by $P \sim f \times C \times V_{DD}^2$, where f is the clock frequency, C is the total active circuit gate capacitance and $V_{DD}$ is the high digital voltage supply for digital circuitries.

While in the standby state, the power consumptions for digital circuitries all come down to the total leakage currents of CMOS inverters and CMOS inverter variations of logic gates from the high digital voltage rail $V_{DD}$ to the ground voltage. When inverter gates or logic gates output logic state "1", the voltage at the output node of the CMOS inverters is $V_{DD}$. The leakage current for the CMOS inverter is the leakage current of the NMOSFET device in the CMOS inverter with gate voltage $V_G=0$ V, drain voltage $V_D=V_{DD}$, source voltage $V_S=0$ V, and substrate voltage $V_{SUB}=0$ V as the device applied voltage bias condition represented by the three intercepted points, 201, 202, and 203 of NMOSFET device I-V characteristic curves in FIG. 2. When inverter gates and logic gates output logic state "0", the voltage at the output node of the CMOS inverters is the ground voltage. The leakage current for the CMOS inverter is the leakage current of the PMOSFET device for gate voltage $V_G=V_{DD}$, drain voltage $V_D=0$ V, source voltage $V_S=V_{DD}$, and N-type well voltage $V_{NWELL}=V_{DD}$, as the device applied voltage bias condition represented by the three intercepted points, 301, 302, and 303 in FIG. 3. To identify the standby leakage currents in digital circuitries, we shall look into the NMOSFET and PMOSFET device current characteristics in details.

Figure 2:
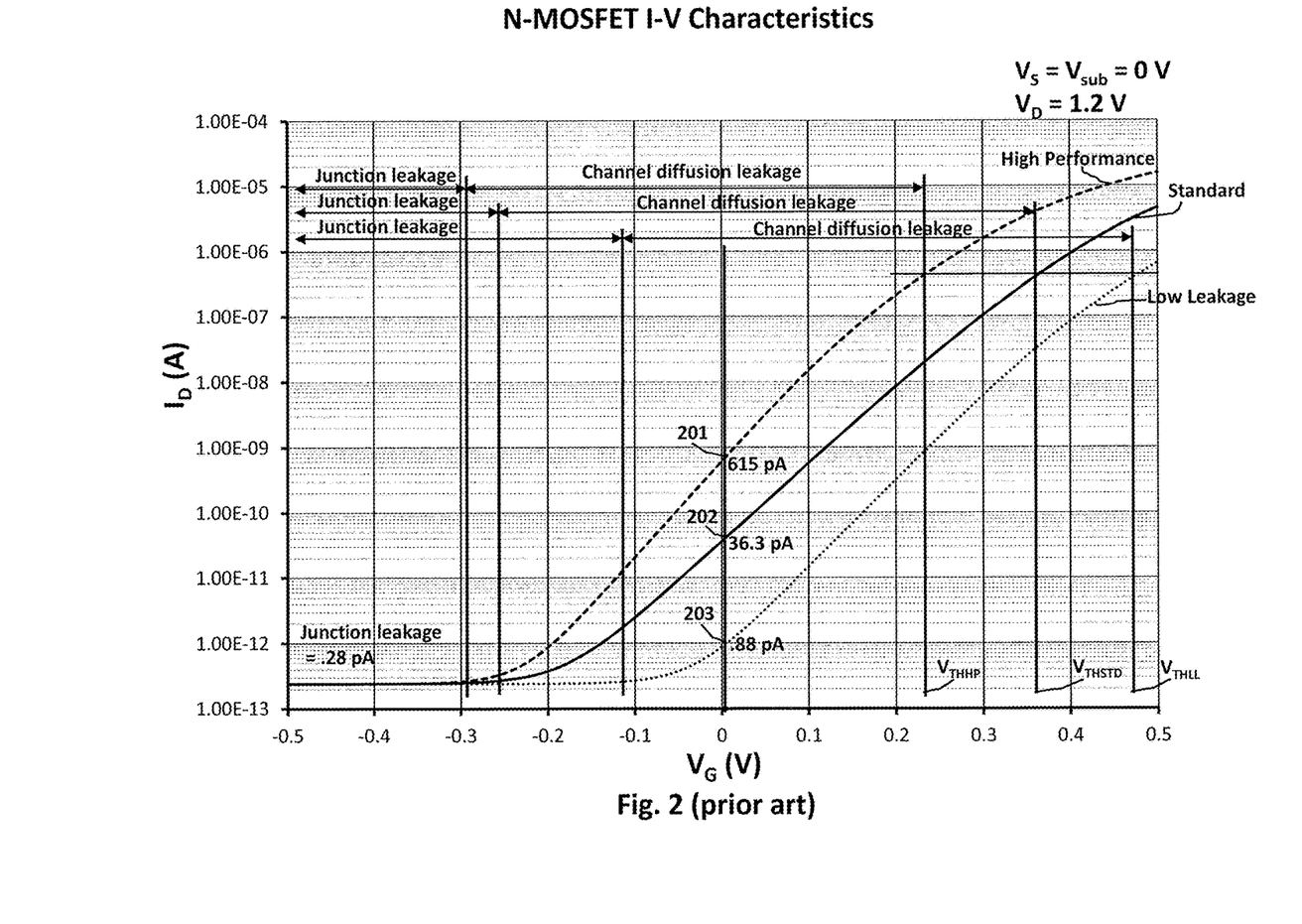
FIG. 2 shows the I-V characteristics of NMOSFET devices for three different threshold voltages.
Figure 3:
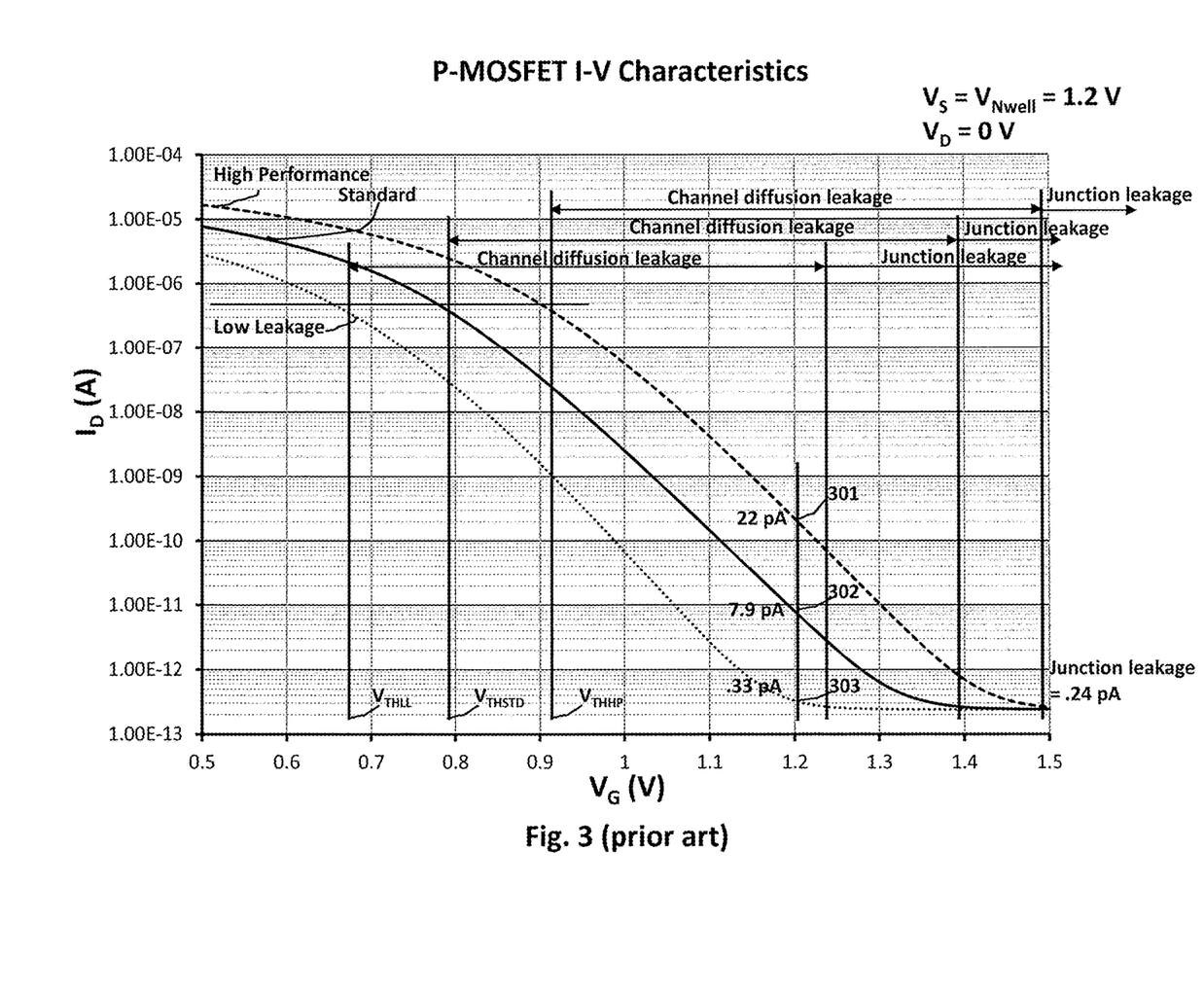
FIG. 3 shows the I-V characteristics of PMOSFET devices for three different threshold voltages.

FIG. 2 shows the drain current versus applied gate voltage for the three different threshold voltage NMOSFET devices of 0.11 μm process technology provided by a CMOS wafer foundry, where the high threshold voltage devices (dotted line) are the low leakage and less driving current devices for small standby current and less computation speed applications, the medium threshold voltage devices (solid line) are the medium leakage and medium driving current devices for the medium standby current and medium computation speed applications, and the low threshold voltage devices (dashed line) are the high leakage and high driving current devices for the large standby current and high computation speed applications. FIG. 3 shows the drain current versus applied gate voltage for the high (dotted line), medium (solid line), and low (dashed line) threshold voltage PMOSFET devices of 0.11 μm process technology provided by the CMOS wafer foundry. From FIG. 2 and FIG. 3, we can identify that the leakage currents in CMOS inverters for the output voltages of $V_{DD}$ and 0 V are the N-channel diffusion currents of NMOSFET devices with the gate voltage $V_G=0$ V, drain voltage $V_D=V_{DD}$, source voltage $V_S=0$ V, and substrate voltage $V_{SUB}=0$ V as the curve three interception points (201, 202, and 203) at $V_G=0$V in FIG. 2, and the P-channel diffusion currents of PMOSFET devices with gate voltage $V_G=V_{DD}$, drain voltage $V_D=0$ V, source voltage $V_S=V_{DD}$, and N-well voltage $V_{NWELL}=V_{DD}$ as the curve three interception points (301, 302, and 303) at $V_G=1.2$ V ($V_{DD}$) in FIG. 3, respectively. Therefore we conclude that the standby currents in digital circuitries come from the channel diffusion currents of NMOSFET devices and PMOSFET devices in CMOS inverters and inverters-like (logic gates).

According to NMOSFET and PMOSFET device characteristics in FIG. 2 and FIG. 3, the standby current in digital circuitries can be reduced by operating NMOSFET devices and PMOSFET devices with the normal digital voltage condition of $V_{DD}$ (1.2 V) and $V_{SS}$ (0 V) from the channel diffusion leakage state toward the drain reverse junction leakage state as the curve flatten regions in FIGS. 2 and 3. Usually the standby current reductions in digital circuitries are done by adjusting N/P MOSFET device designs such as the threshold voltage adjustment as seen the NMOSFET device characteristics (curve shifting to right) for the low-medium-high threshold voltages in FIG. 2 and the PMOSFET device characteristics (curve shifting to left) for the low-medium-high threshold voltages (negative) in FIG. 3, or material work function adjustment of N/P MOSFET devices, or by back-biasing the bodies (or the source electrodes) of MOSFET devices (equivalently shifting up the device threshold voltages) at standby mode. However, there is always a trade-off between channel diffusion currents and driving currents for shifting up the threshold voltages of MOSFET devices for the fixed logic voltage swing of $V_{DD}$ to $V_{SS}$ (=0 V). That is, increasing device threshold voltages ($V_{th}$) for reducing the channel diffusion currents also degrades the current driving capacity of MOSFET devices due to a smaller on-voltage increment of ($V_{DD}-V_{th}$), and visa versus. It will be very desirable that MOSFET devices can be operated with high driving currents for the computation speed performance in active state, while the leakage currents of MOSFET devices are operated toward the minimum currents of the drain reverse junction leakage state in standby state. One method to achieve the above described operations for MOSFET devices includes removing the voltage biases ($V_{DD}$ for PMOSFET devices and $V_{SS}$ (=0V) for NMOSFET devices) from the source electrodes of PMOSFET and NMOSFET in standby state such that there is no electrical fields generated between source electrodes and drain electrodes of the MOSFET devices to create the channel diffusion currents.

Figure 4:
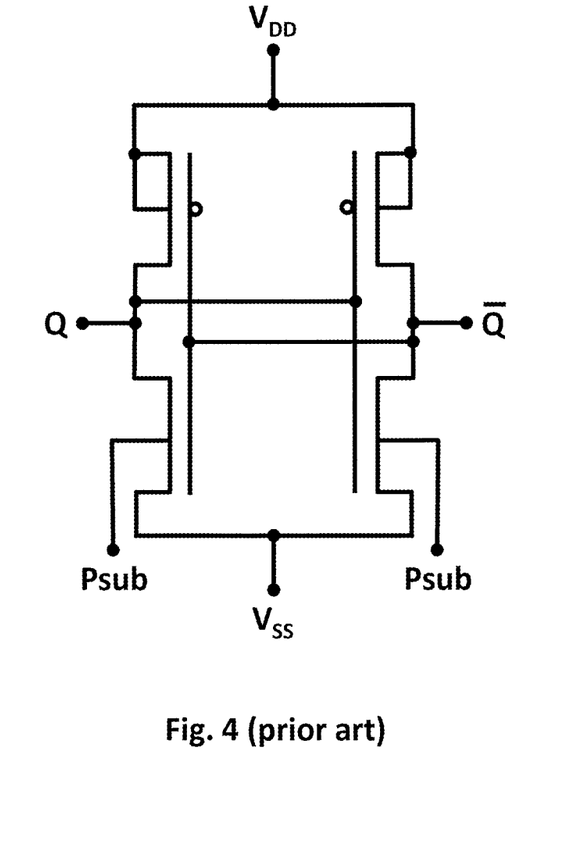
FIG. 4 shows the schematic of a latch for storing one digital datum.
Figure 5A:
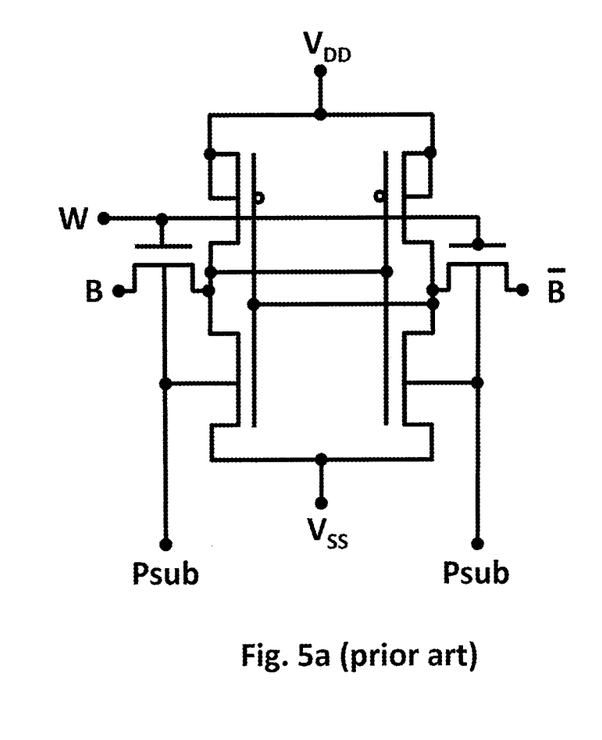
FIGS. 5a and 5b respectively show the schematics of an SRAM cell and a D-Flip Flop.
Figure 5B:
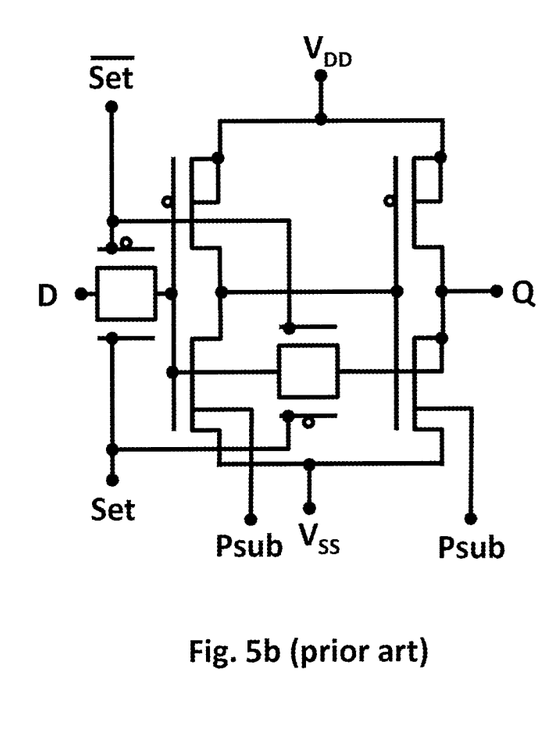
Figure 6:
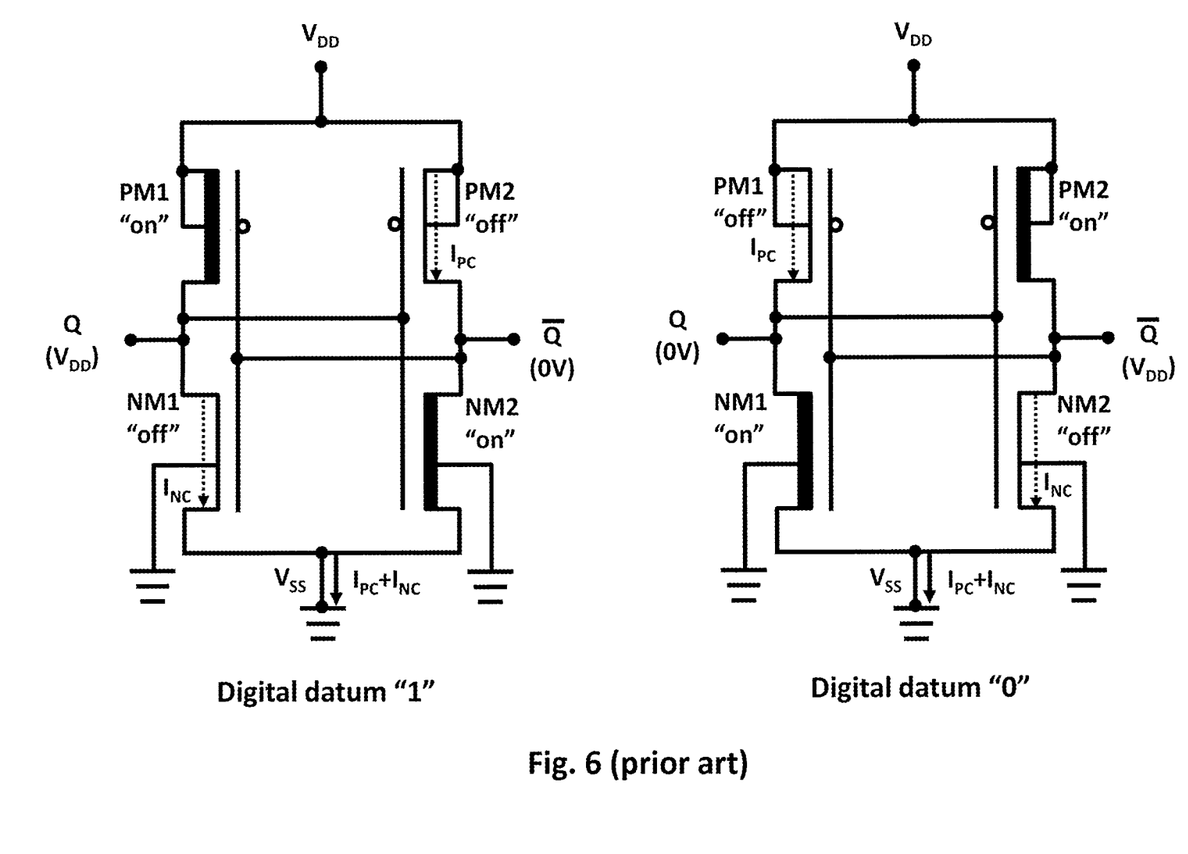
FIG. 6 illustrates the leakage current paths of the latch for storing digital data "1" and "0".

Since digital memories for storing computation instructions and data from logic operations usually occupy major portions of digital circuitries, the standby currents for digital circuitries are mostly contributed from the standby currents of the digital memory cells. The basic component, such as an SRAM cell, a Flip-Flop, a data buffer, and a register, for storing a digital datum in digital circuitries contains a latch shown in FIG. 4. For example, the schematics of an SRAM cell and a D Flip-Flop are shown in FIG. 5a and FIG. 5b, respectively. The major leakage current from the power supply rail $V_{DD}$ to ground voltage for a digital memory is the sum of one P-type MOSFET channel diffusion current $I_{PC}$ and one N-type MOSFET channel diffusion current $I_{NC}$ through the grounded $V_{SS}$ node as illustrated in FIG. 6, besides a small amount of reverse junction leakage currents from the source/drain electrodes of NMOSFET devices and the N-well of the PMOSFET devices to the grounded substrate.

To reduce the leakage currents of digital memories in their standby state, one may want to operate the N/P MOSFET devices away from the channel diffusion leakage state and toward the reverse junction leakage state, while keeping the originally stored digital data intact. For example, methods of shifting the MOSFET device operating threshold voltages in digital memories are disclosed by: Ma teaches applying a voltage bias to the low digital voltage node of SRAM cells disclosed in U.S. Pat. No. 6,560,139; Ouchi teaches back-biasing the bodies of the PMOSFET devices and NMOSFET devices in 6T SRAM cells for data holding state (standby) disclosed in U.S. Pat. No. 8,077,510; Deng teaches applying voltage biases, $V_{DA}<V_{DD}$ to the high digital voltage node and $V_{SA}>0$ V to the low digital voltage node respectively for both periphery circuitry and SRAM array in standby state disclosed in U.S. Pat. No. 7,039,818. It is also noted that the applying voltage biases other than $V_{DD}$ and $V_{SS}$ (=0V) to the high digital voltage nodes and the low digital voltage nodes of digital circuitry in standby mode would also require the recovering time for charging or discharging back to the normal digital voltage biases in active mode.

The ideal minimum leakage current for a digital memory cell can be obtained by summing PMOSFET drain reverse junction leakage current $I_{PD}$ and NMOSFET drain reverse junction leakage current $I_{ND}$. Usually, the channel diffusion currents $I_{PC}$ and $I_{NC}$ are at least several factors to several orders of magnitudes larger than the drain reverse junction leakage currents $I_{PD}$ and $I_{ND}$ as the examples seen in FIG. 2 and FIG. 3. Motivated by the leakage current path analysis in digital memory cells and the method of removing the source voltage biases of MOSFET devices for the device reverse junction leakage currents, we have developed standby current reduction schemes for digital data storing components in digital circuitries.

SUMMARY OF THE INVENTION

Figure 7A:
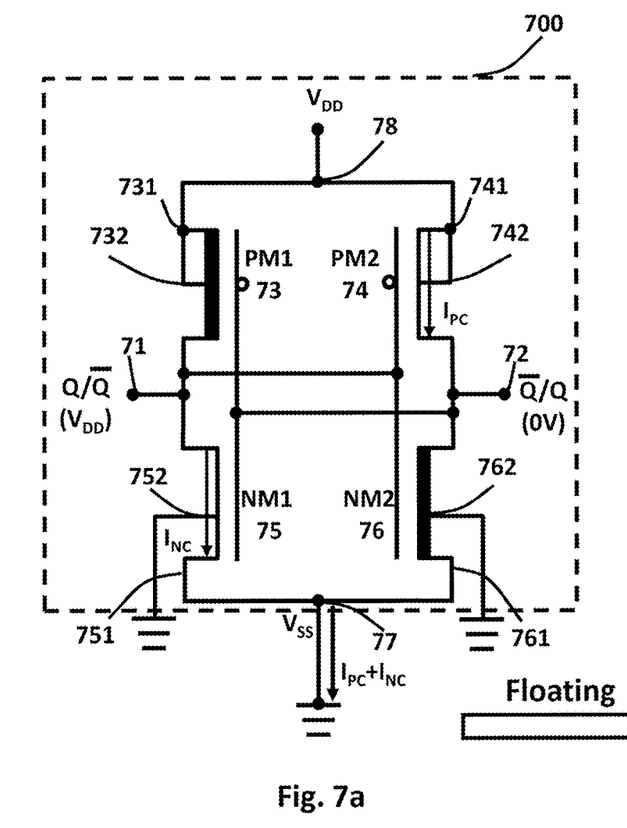
FIGS. 7a and 7b respectively illustrate the voltage variations at Q node 72 of the latch with the grounded node 77 and the floated node 77 according to the invention.
Figure 7B:
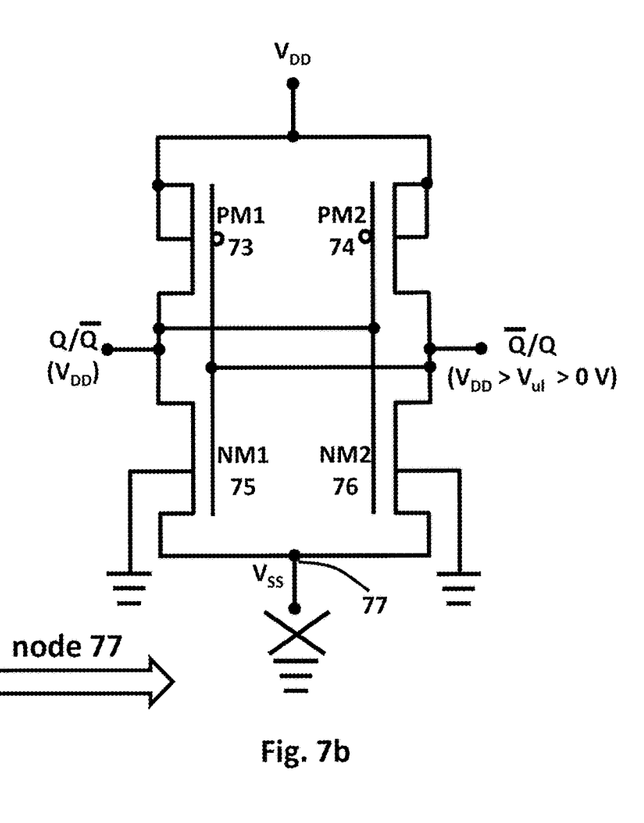

Since a digital data storing component of the invention usually contains a symmetrical latch, we will illustrate the operation for the case of storing digital datum "1". The same principle can be applied for the case of storing digital datum "0" as well. As shown in FIG. 7a, the output nodes, Q 71 and $\overline{Q}$ 72, of the latch 700 have the voltage signal $V_{DD}$ and the ground voltage respectively for storing a single bit "1". When we disconnect the low digital voltage node 77 (the source electrodes 751 and 761 of NMOSFET devices, 75 and 76) from the ground voltage with the grounded substrate bodies 752 and 762, and connect the voltage bias $V_{DD}$ to the high digital voltage node 78 (source electrodes 731 and 741 of the PMOSFET devices 73 and 74) and N-well bodies 732 and 742 of the PMOSFET devices 73 and 74, the channel diffusion currents (channel leakage current) of the PMOSFET device 74 begins to charge the $\overline{Q}$ node 72. The voltage of $\overline{Q}$ node 72 will be raised during the leakage current charging process as illustrated in FIG. 7b. Depending on the magnitudes of the leakage currents of the P/N MOSFET devices, the voltage at $\overline{Q}$ node 72 eventually reaches an ultimate voltage $V_{ul}<V_{DD}$. When the ultimate voltage $V_{ul}$ is close to $V_{DD}$, the asymmetric voltages at the output nodes Q 71 and $\overline{Q}$ 72 for representing the digital datum become ambiguous and unable to be recovered from the originally stored datum by reconnecting the low digital voltage node 77 to the ground voltage. The originally stored digital datum is totally lost. On the other hand, if the margin of the asymmetric voltages at the output nodes Q 71 and $\overline{Q}$ 72 is sufficient, the original stored datum can be recovered by reconnecting the low digital voltage node 77 back to the ground voltage as shown in FIG. 8.

Figure 8:
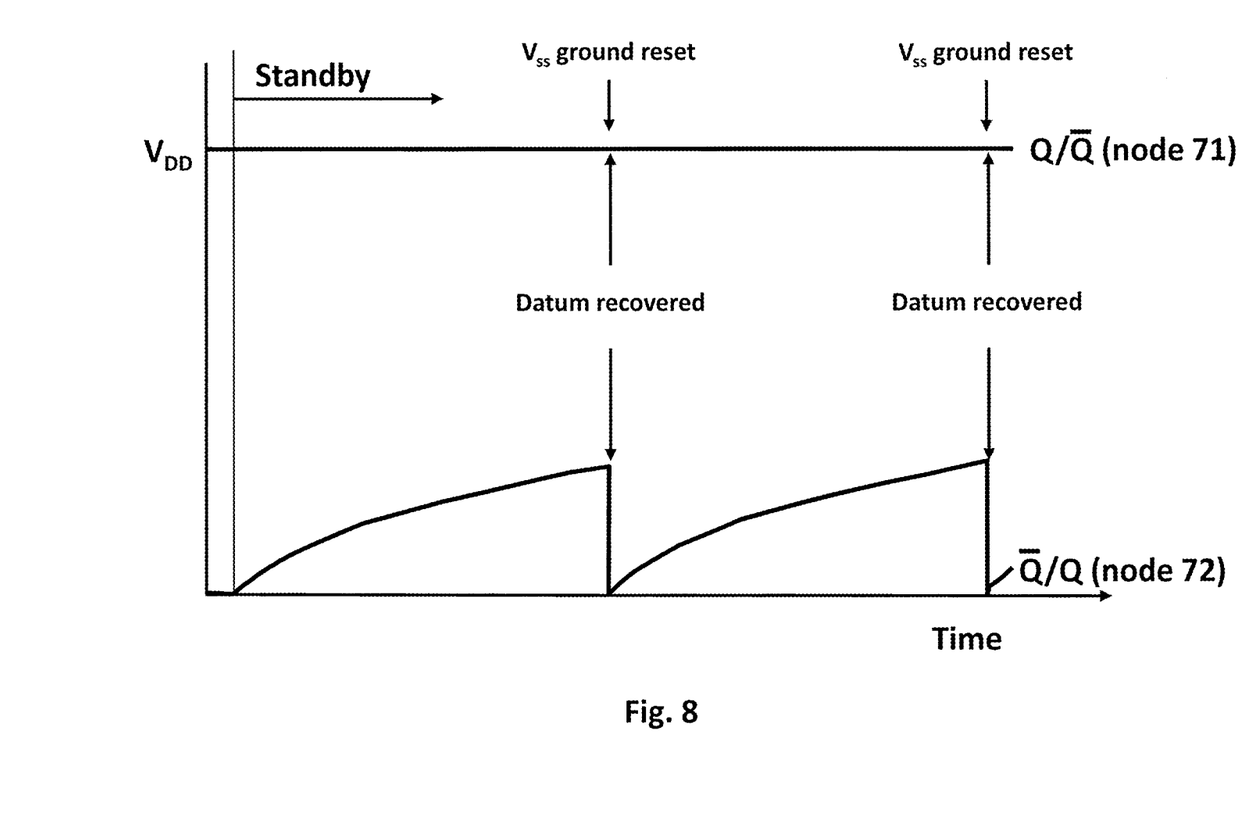
FIG. 8 shows the voltage variations at the output nodes Q and Q of the latch for an SRAM cell applied with a ground-voltage/floating sequence to the node 77 according to the invention.

Since there is no external voltage bias to the low digital voltage node 77 other than floating the low digital voltage node 77, the data recovering process is instant as seen in FIG. 8. It is also noted that since there is no leakage current path through the low digital voltage node 77 to the ground voltage except the reverse junction leakage currents from the source/drain electrodes of NMOSFET devices 75 and 76 and the N-well of the PMOSFET devices 73 and 74 to the grounded substrate. Therefore the standby leakage current of the latch 700 (from the high voltage potential $V_{DD}$ to the ground voltage) is significantly reduced during the time of floating the low digital voltage node 77.

The standby leakage current reduction schemes for digital data storing components can be designed for two scenarios based on whether the maximum ultimate voltage $V_{ulmax}$ for the operational digital data storing components in a digital circuitry is greater than or less than $(V_{DD}-V_M)$, where $V_{ulmax}$ denotes the maximum ultimate voltage for the output node of the digital data storing component having logic state "0" during the whole standby state (e.g., the maximum ultimate voltage at node 72 during the leakage current charging process as illustrated in FIG. 7b) and the voltage $V_M$ is defined as the design margin voltage below the digital high voltage $V_{DD}$. Examples for digital data storing components include, without limitation, Static Random Access Memory (SRAM) cells, Flip-Flops (FF), data buffers, and data registers. Each of data storing components always contains a latch.

Figure 9:
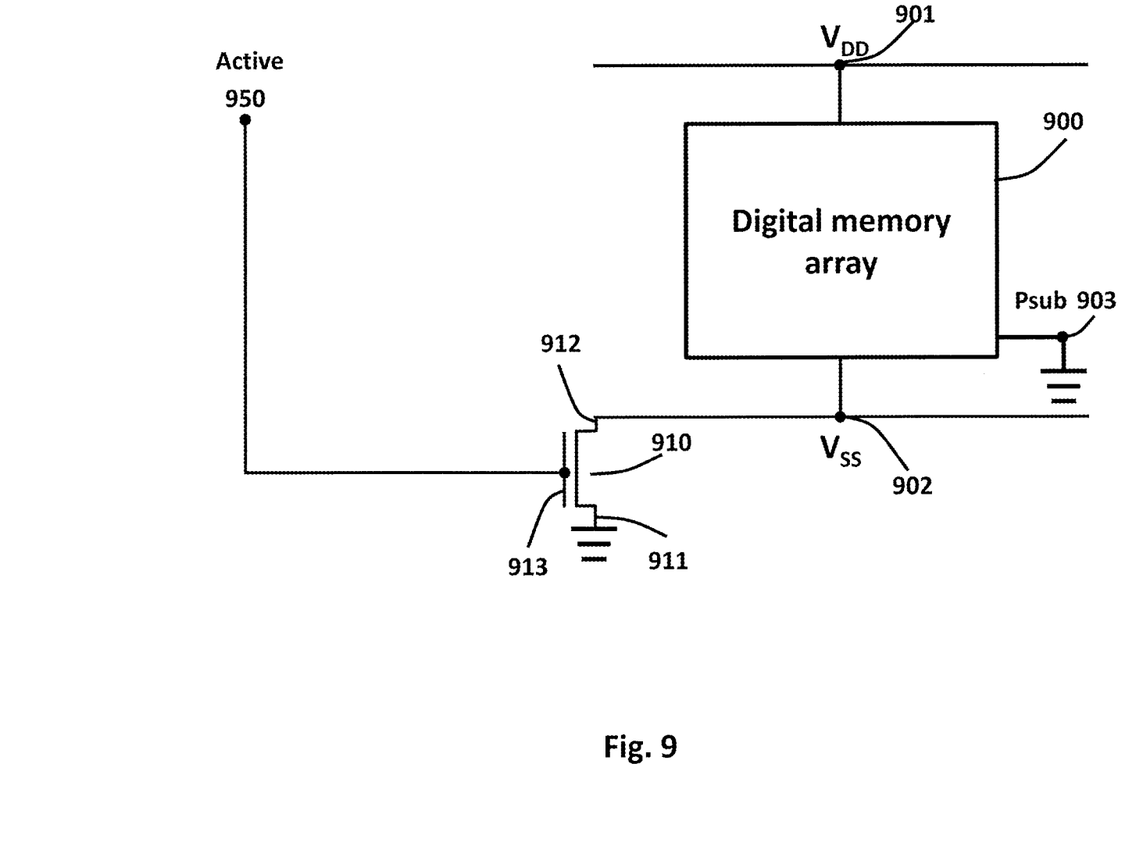
FIG. 9 shows the standby leakage current reduction scheme for the case of $(V_{ulmax}<(V_{DD}-V_M))$ according to an embodiment of the invention.

In the case of $(V_{ulmax}<(V_{DD}-V_M))$ for the operational digital data storing components in the digital circuitries, the scheme is shown in FIG. 9. A digital memory array 900 (e.g., containing a plurality of SRAM cells) has a high digital voltage node 901, a low digital voltage node 902 and P-substrate 903 tied to the ground voltage. The low digital voltage node 902 of the digital memory array 900 is connected to the drain electrode 912 of the MOSFET switch 910 with the source electrode 911 tied to the ground voltage. The gate 913 of the MOSFET switch 910 is connected to the "active" node 950. When the "active" node 950 is enabled with a "high" digital voltage signal $V_{DD}$, the MOSFET switch 910 is turned on to connect the ground voltage to the low digital voltage node 902 for active read/write operations. Otherwise, the MOSFET switch 910 is switched off for floating the low digital voltage node 902 for the standby current reduction.

Figure 10:
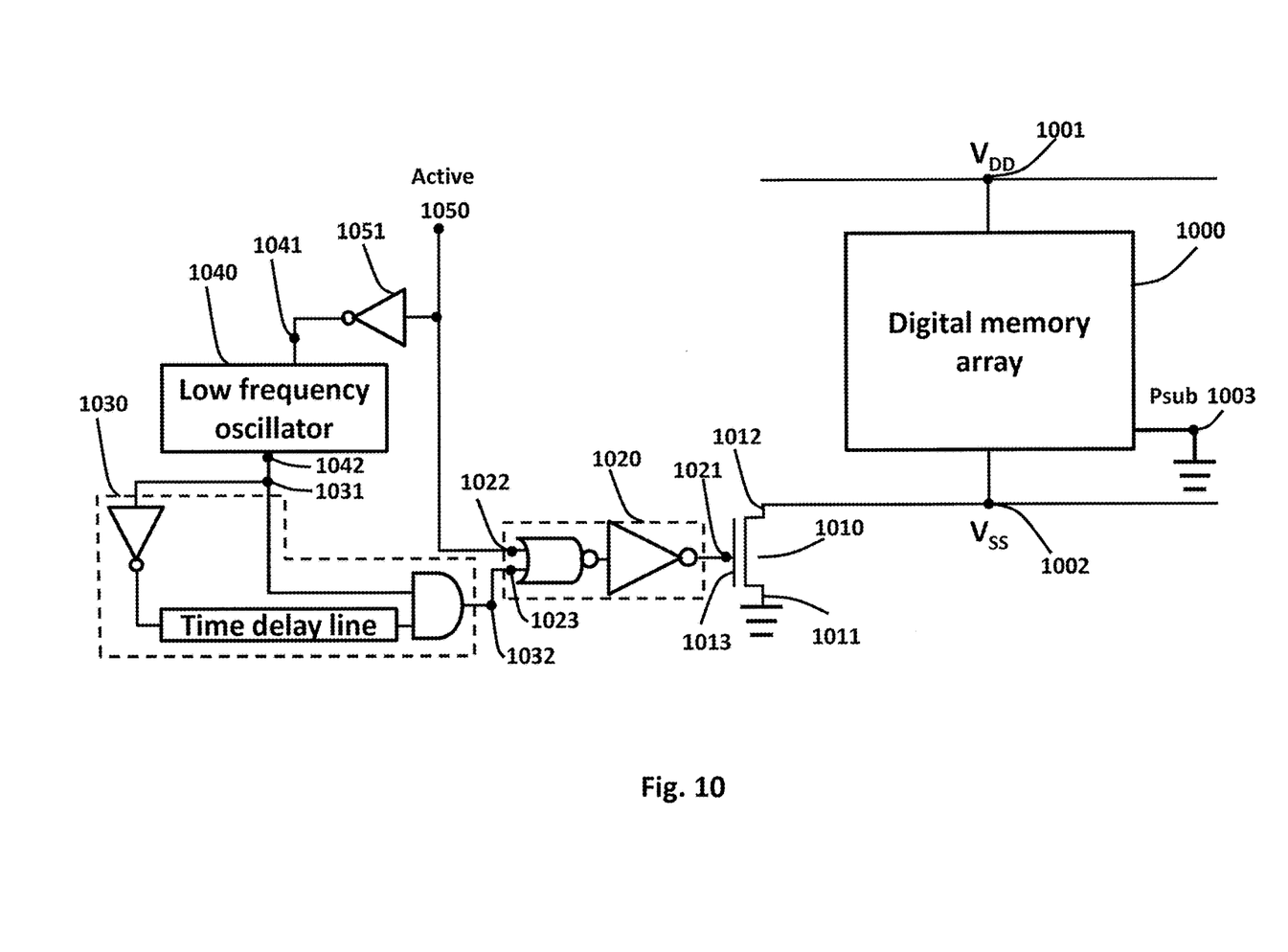
FIG. 10 shows the standby leakage current reduction scheme for the case of $(V_{ulmax}>(V_{DD}-V_M))$ according to another embodiment of the invention.
Figure 11A:
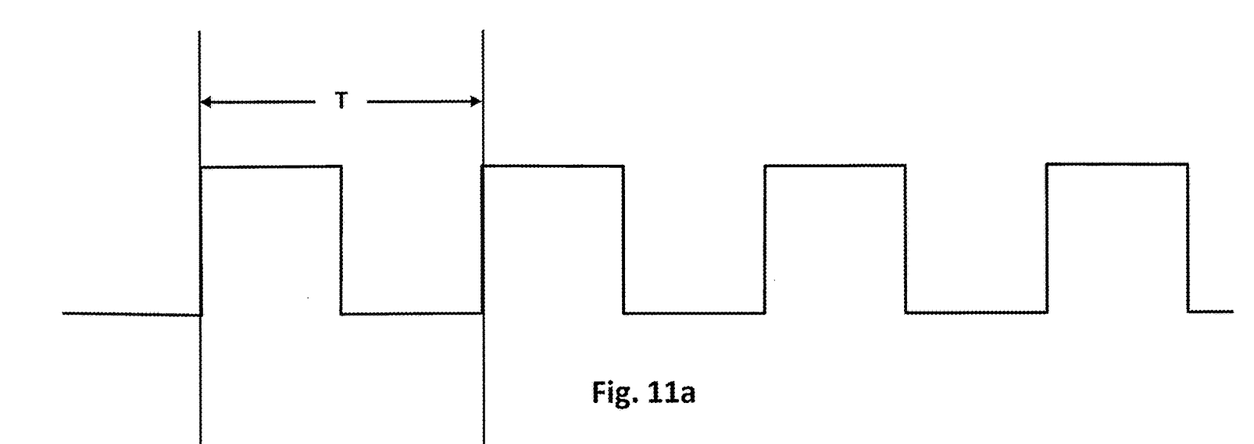
FIGS. 11a and 11b respectively show the output waveform of the low frequency oscillator with frequency 1/T and the output waveform of the pulse generator with pulse duration δ according to the invention.
Figure 11B:
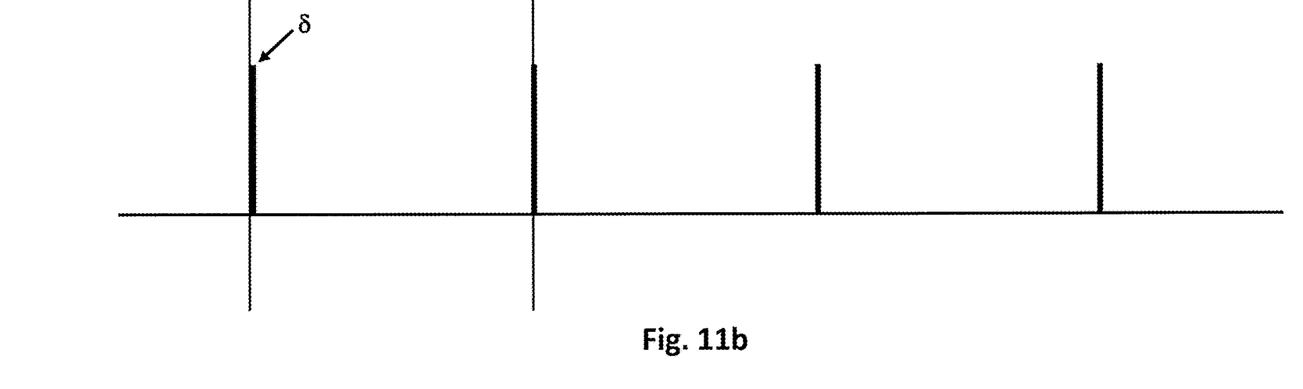

In the case of $(V_{ulmax}>(V_{DD}-V_M))$ for the operational digital data storing components in digital circuitries, the schematics for the standby leakage reduction scheme is shown in FIG. 10. A digital memory array 1000 (e.g., containing a plurality of SRAM cells) has a high digital voltage node 1001, a low digital voltage node 1002 and P-substrate 1003 tied to the ground voltage. The low digital voltage node 1002 of the digital memory array 1000 is connected to the drain electrode 1012 of the MOSFET switch 1010 with the source electrode 1011 tied to the ground voltage. The gate 1013 of the MOSFET switch 1010 is connected to the output node 1021 of a logic "OR" gate 1020. The input nodes 1022 and 1023 of the logic "OR" gate 1020 are connected to the "active" enable node 1050 and the output node 1032 of a pulse generator 1030, respectively. A low frequency oscillator 1040 has an enable node 1041 (high active) connected to the output of the inverter 1051 with its input connected to the "active" node 1050 and an output node 1042 connected to the input node 1031 of the pulse generator 1030. When the "active" node 1050 receives a digital "high" voltage signal $V_{DD}$, the low frequency oscillator 1040 is disabled. Meanwhile the output of logic "OR" gate 1020 is at the "high" voltage state to turn on the MOSFET switch 1010 for connecting the low digital voltage node 1002 to the ground voltage. When the digital memory array 1000 is not activated by a "low" voltage signal (ground voltage) at the "active" node 1050, the low frequency oscillator 1040 is activated to generate a voltage clock waveform with time period T shown in FIG. 11a and then trigger the pulse generator 1030. Meanwhile the logic "OR" gate 1020 is passing the voltage waveform (FIG. 11b) of the pulse generator 1030 with a pulse "on" duration δ to the gate 1013 of the MOSFET switch 1010. The MOSFET switch 1010 is thus turned on to connect the low digital voltage node 1002 of the digital memory array 1000 to the ground voltage during the pulse "on" period δ. Otherwise, the low digital voltage node 1002 is floating outside the pulse "on" period δ.

BRIEF DESCRIPTION OF THE DRAWINGS

For a better understanding of the present invention and to show how it may be carried into effect, reference will now be made to the following drawings, which show the preferred embodiment of the present invention, in which.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

In one embodiment for the case of $(V_{ulmax}<(V_D-V_M))$, according to the scheme in FIG. 9, we have constructed a 256 kb 6T SRAM array with the nominal high threshold voltage P/N MOSFET devices ($V_{THLL}$ in FIG. 2 and FIG. 3) fabricated by the foundry's 0.11 μm CMOS logic process. The standby leakage current for the 256 kb SRAM device is reduced from ~3.1 μA to ~1.8 μA by applying the scheme in FIG. 9. The standby current reduction for the scheme is about 72% improvement. Meanwhile, the data retention for the 256 kb SRAM device remains intact during the time period of floating the low digital voltage node 902. From the random access time measurement for the SRAM device, the data recovering time delay from the standby mode to the active mode (read/write operations) is insignificant.

In one embodiment for the case of $((V_{ulmax}<(V_{DD}-V_M))$, according to the scheme in FIG. 9, we have constructed a 256 kb 6T SRAM array with the nominal medium threshold voltage P/N MOSFET devices ($V_{THSTD}$ in FIG. 2 and FIG. 3) fabricated by the foundry's 0.11 μm CMOS logic process. The standby leakage current for the 256 kb SRAM device is reduced from ~26.4 μA to ~2.45 μA by applying the scheme in FIG. 9. The standby current reduction for the scheme is about 10 fold improvement. Meanwhile, the data retention for the 256 Mb SRAM remains intact during the time period of floating the node 902. From the random access time measurement for the SRAM device, the data recovering time delay from the standby mode to the active mode (read/write operations) is insignificant.

Figure 12:
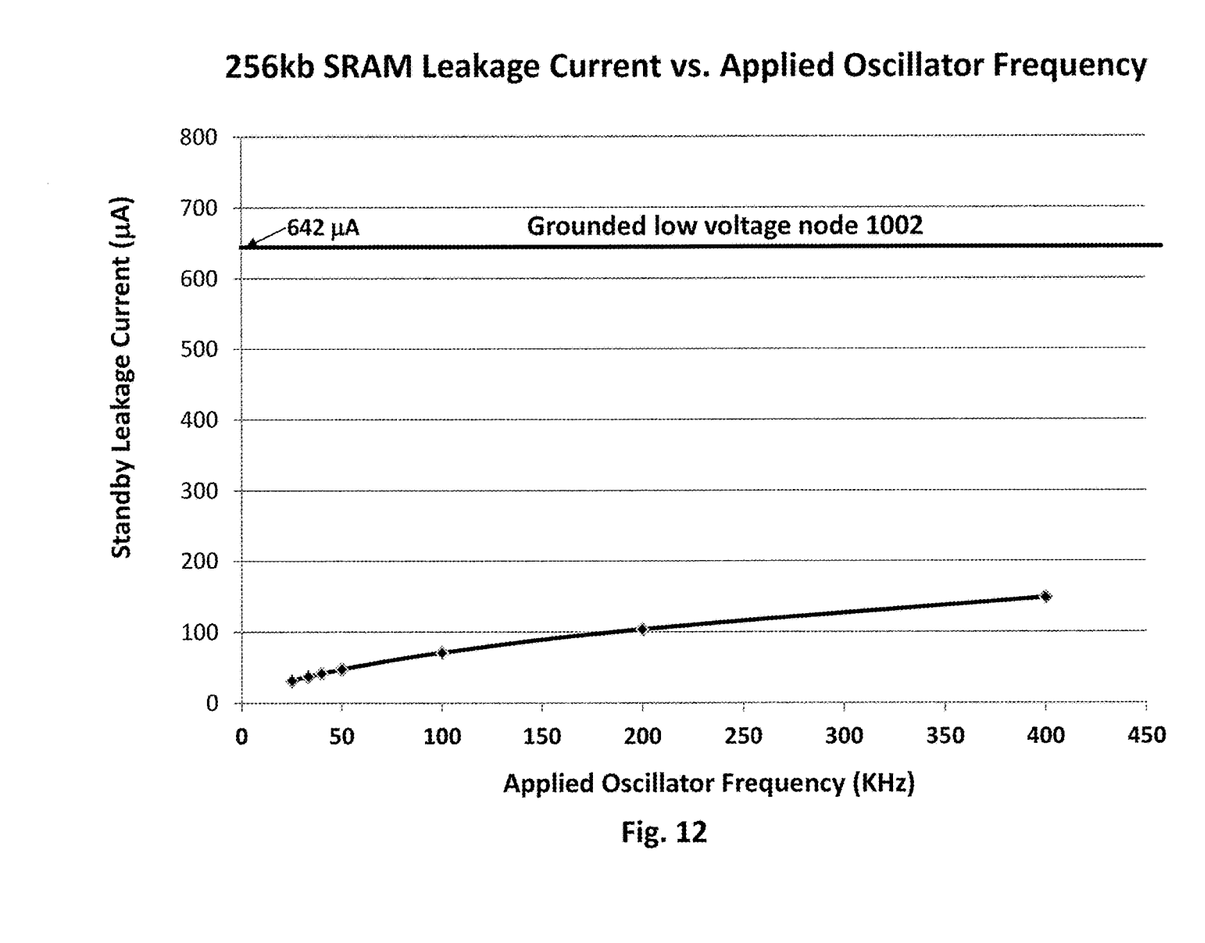
FIG. 12 shows the standby leakage current versus the applied oscillator frequency for the 256 kb SRAM device according to the invention.

In one embodiment for the case of $(V_{ulmax}>(V_{DD}-V_M))$, according to the scheme in FIG. 10, we have constructed a 256 kb 6T SRAM array with the nominal low threshold voltage P/N MOSFET devices ($V_{THHP}$ in FIG. 2 and FIG. 3) fabricated by the foundry's 0.11 μm CMOS logic process. An external clock oscillator with adjustable frequencies drives an on-chip pulse generator with pulse duration of ~10 ns. FIG. 12 shows the standby leakage current versus the applied oscillator frequency for the 256 kb SRAM device. As seen in FIG. 12, the standby leakage current by applying the scheme in FIG. 10 for the 256 kb SRAM device can be significantly reduced as large as 20 times, and the standby leakage current decreases as the applied oscillator frequency decreases. Meanwhile, the data retention for the 256 Mb SRAM remains intact during the time of floating the low digital voltage node 1002. From the random access time measurement for the SRAM device, the data recovering time delay from the standby mode to the active mode (read/write operations) is insignificant.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A digital data storing unit comprising:
   a plurality of digital data storing components, each comprising a latch and connected between a high digital voltage rail and a low digital voltage node; and
   a switch device connected between the low digital voltage node and a ground voltage rail, wherein the switch device is always turned off to float the low digital voltage node during a standby period;
   if $V_{ulmax} < (V_{DD} - V_M)$, where $V_{DD}$ denotes the high digital voltage rail, $V_M$ denotes a design margin voltage below the high digital voltage rail, and $V_{ulmax}$ denotes a maximum ultimate voltage for a plurality of output nodes of the digital data storing components having logic state "0" during the standby period.

2. The digital data storing unit according to claim 1, wherein the digital data storing component are selected from the group comprising SRAM cells, Flip-Flops, data buffers, and registers.

3. The digital data storing unit according to claim 1, wherein the switch device connects the low digital voltage node to the ground voltage rail during read/write operations.

4. The digital data storing unit according to claim 1, wherein the switch device is an N-type MOSFET device.

5. A digital data storing unit comprising:
   a plurality of digital data storing components, each comprising a latch and connected between a high digital voltage rail and a low digital voltage node; and
   a switch device connected between the low digital voltage node and a ground voltage rail, wherein the switching transistor is periodically turned off and on to periodically float and ground the low digital voltage node during a standby period;
   wherein $V_{ulmax} > (V_{DD} - V_M)$, where $V_{DD}$ denotes the high digital voltage rail, $V_M$ denotes a design margin voltage below the high digital voltage rail, and $V_{ulmax}$ denotes a maximum ultimate voltage for a plurality of output nodes of the digital data storing components having logic state "0" during the standby period.

6. The digital data storing unit according to claim 5, wherein the switch device is periodically turned off and on according to a plurality of periodical voltage pulses during the standby period.

7. The digital data storing unit according to claim 6, wherein each periodical voltage pulse is divided into a pulse on period and a pulse off period, and wherein the switch device is turned on to connect the low digital voltage node to the ground voltage rail during the pulse on period and is turned off to float the low digital voltage node during the pulse off period.

8. The digital data storing unit according to claim 6, further comprising:
   a low frequency oscillator having an input terminal coupled to an active node, wherein the switch device is an N-type MOSFET device;
   a pulse generator coupled to the output terminal of the low frequency oscillator; and
   a logic OR gate having a first input node connected to the active node, a second input node connected to the output terminal of the pulse generator and an output node connected to the gate of the N-type MOSFET device;
   wherein the active node is applied with a first voltage level to disable the low frequency oscillator during read/write operations, and is applied with a second voltage level to cause the low frequency oscillator to trigger the pulse generator to generate the periodical voltage pulses during the standby period.

9. The digital data storing unit according to claim 5, wherein the standby leakage currents in the digital data storing components decrease as a frequency of the periodical voltage pulses decreases.

10. The digital data storing unit according to claim 5, wherein the digital data storing component are selected from the group comprising SRAM cells, Flip-Flops, data buffers, and registers.

11. A method of reducing standby leakage currents in a plurality of digital data storing components in a digital data storing unit, wherein each digital data storing component comprises a latch, the method comprising:
    connecting each of the digital data storing components between a high digital voltage rail and a low digital voltage node; and
    floating the low digital voltage node by always turning off a switch device coupled between the low digital voltage node and a ground voltage rail during a standby period;
    wherein $V_{ulmax} < (V_{DD} - V_M)$, where $V_{DD}$ denotes the high digital voltage rail, $V_M$ denotes a design margin voltage below the high digital voltage rail, and $V_{ulmax}$ denotes a maximum ultimate voltage for a plurality of output nodes of the digital data storing components having logic state "0" during the standby period.

12. The method according to claim 11, wherein the digital data storing components are selected from the group comprising SRAM cells, Flip-Flops, data buffers and registers.

13. The method according to claim 11, further comprising:

connecting the low digital voltage rail node to the ground voltage rail by turning on the switch device during read/write operations.

14. The method according to claim 11, wherein the switch device is an N-type MOSFET device.

15. A method of reducing standby leakage currents in a plurality of digital data storing components in a digital data storing unit, wherein each digital data storing component comprises a latch, the method comprising:
connecting each of the digital data storing components between a high digital voltage rail and a low digital voltage node; and
periodically floating and grounding the low digital voltage node by periodically turning off and on the switch device during a standby period;
wherein $V_{ulmax} > (V_{DD} - V_M)$, where $V_{DD}$ denotes the high digital voltage rail, $V_M$ denotes a design margin voltage below the high digital voltage rail, and $V_{ulmax}$ denotes a maximum ultimate voltage for a plurality of output nodes of the digital data storing components having logic state "0" during the standby period.

16. The method according to claim 15, wherein the step of periodically floating and grounding the low digital voltage node comprises:
periodically floating and grounding the low digital voltage node by periodically turning off and on the switch device according to a plurality of periodical voltage pulses during the standby period.

17. The method according to claim 16, wherein each periodical voltage pulse is divided into a pulse on period and a pulse off period, wherein the step of periodically floating and grounding the low digital voltage node comprises:
connecting the low digital voltage node to the ground voltage rail by turning on the switch device during the pulse on period; and
floating the low digital voltage node by turning off the switch device during the pulse off period.

18. The method according to claim 16, wherein the step of periodically floating and grounding the low digital voltage node comprises:
connecting the output terminal of a low frequency oscillator to the input terminal of a pulse generator;
connecting the output terminal of the pulse generator to a gate of the switch device connected between the low digital voltage node and the ground voltage rail, wherein the switch device is an N-type MOSFET device; and
applying a first voltage level to the input terminal of the low frequency oscillator to cause the pulse generator to generate the periodical voltage pulses during the standby period; and
periodically floating the low digital voltage node and connecting the low digital voltage node to the ground voltage rail by periodically turning off and on the N-type MOSFET device according to the periodical voltage pulses.

19. The method according to claim 18, further comprising:
applying a second voltage level to the input terminal of the low frequency oscillator to disable the low frequency oscillator during read/write operations.

20. The method according to claim 16, wherein the standby leakage currents decrease as a frequency of the periodical voltage pulses decreases.

21. The method according to claim 15, wherein the digital data storing component are selected from the group comprising SRAM cells, Flip-Flops, data buffers, and registers.

* * * * *